(12) United States Patent
Ge

(10) Patent No.: US 11,531,728 B2
(45) Date of Patent: Dec. 20, 2022

(54) TWO-STAGE RAMP ADC IN CROSSBAR ARRAY CIRCUITS FOR HIGH-SPEED MATRIX MULTIPLICATION COMPUTING

(71) Applicant: TETRAMEM INC., Newark, CA (US)

(72) Inventor: Ning Ge, Newark, CA (US)

(73) Assignee: TetraMem Inc., Fremont, CA (US)

( * ) Notice: Subject to any disclaimer, the term of this patent is extended or adjusted under 35 U.S.C. 154(b) by 357 days.

(21) Appl. No.: 16/805,764

(22) Filed: Feb. 29, 2020

(65) Prior Publication Data

US 2021/0271732 A1 Sep. 2, 2021

(51) Int. Cl.
| | |
|---|---|
| *H03M 1/56* | (2006.01) |
| *G06F 17/16* | (2006.01) |
| *H03M 1/66* | (2006.01) |
| *H04Q 3/00* | (2006.01) |

(52) U.S. Cl.
CPC .............. *G06F 17/16* (2013.01); *H03M 1/66* (2013.01); *H04Q 3/0004* (2013.01)

(58) Field of Classification Search
CPC ............ H03M 1/56; H03M 1/34; H03M 1/66; H03M 1/00; H03M 1/0607; H03M 1/466; H03M 1/52; H03M 1/12; H03M 1/1009; H03M 1/124; H03M 1/1295; H03M 1/38; H03M 1/442; H03M 1/123; H03M 1/50; H03M 1/0845; H04N 5/378; H04N 5/3745; H04N 5/37455; H04N 5/37457; H04N 5/335; H04N 5/35563; H04N 5/36961; H04N 5/3742; H04N 5/37452

USPC ................ 341/155, 164, 165, 169, 170, 172
See application file for complete search history.

(56) References Cited

U.S. PATENT DOCUMENTS

| | | | | |
|---|---|---|---|---|
| 5,138,552 A | * | 8/1992 | Weedon ................ | H03M 1/123 341/157 |
| 7,479,916 B1 | * | 1/2009 | Reshef .................. | H03M 1/123 341/169 |
| 2013/0341489 A1 | * | 12/2013 | Yoshida .................. | H03M 1/34 250/208.1 |
| 2018/0249110 A1 | * | 8/2018 | Kobayashi ......... | H04N 5/23245 |
| 2019/0116329 A1 | * | 4/2019 | Oka ........................ | H04N 5/355 |
| 2020/0200603 A1 | * | 6/2020 | Xu ............................ | G01J 1/46 |
| 2020/0295739 A1 | * | 9/2020 | Zuo .................... | H04N 5/37457 |
| 2021/0021782 A1 | * | 1/2021 | Sato ...................... | H04N 5/3658 |
| 2021/0149984 A1 | * | 5/2021 | Luo ....................... | G11C 7/1006 |
| 2021/0185250 A1 | * | 6/2021 | Moue ...................... | H04N 5/357 |
| 2021/0344854 A1 | * | 11/2021 | Bock ..................... | H04N 5/351 |

(Continued)

*Primary Examiner* — Linh V Nguyen
(74) *Attorney, Agent, or Firm* — Jaffery Watson Mendonsa & Hamilton LLP

(57) ABSTRACT

Technologies relating to implementing two-stage ramp ADCs in crossbar array circuits for high performance matrix multiplication are disclosed. An example two-stage ramp ADC includes: a transimpedance amplifier configured to convert an input signal from current to voltage; a comparator connected to the transimpedance amplifier; a switch bias set connected to the comparator; a switch side capacitor in parallel with the switch bias set; a ramp side capacitor in parallel with the switch bias set; a ramp generator connected to the comparator via the ramp side capacitor, wherein the ramp generator is configured to generate a ramp signal; a counter; and a memory connected to the comparator, wherein the memory is configured to store an output of the comparator.

13 Claims, 3 Drawing Sheets

(56) References Cited

U.S. PATENT DOCUMENTS

2021/0351768 A1\* 11/2021 Fan ..................... H04N 5/378
2021/0389353 A1\* 12/2021 Bhargava ............... H03K 21/08

\* cited by examiner

TWO-STAGE RAMP ADC IN CROSSBAR ARRAY CIRCUITS FOR HIGH-SPEED MATRIX MULTIPLICATION COMPUTING

TECHNICAL FIELD

The present disclosure relates generally to crossbar array circuits and more specifically to implementing two-stage ramp Analog to Digital Converters (ADCs) in crossbar array circuits for high-speed matrix computing.

BACKGROUND

Traditionally, a crossbar array circuit may include horizontal metal wire rows and vertical metal wire columns (or other electrodes) intersecting with each other, with crossbar devices formed at the intersecting points. A crossbar array may be used in non-volatile solid-state memory, signal processing, control systems, high-speed image processing systems, neural network systems, and so on.

A Resistive Random-Access Memory (RRAM) is a two-terminal passive device capable of changing resistance responsive to sufficient electrical stimulations, which have attracted significant attention for high-performance non-volatile memory applications. The resistance of an RRAM may be electrically switched between two states: a High-Resistance State (HRS) state and a Low-Resistance State (LRS) state. The process in which a RRAM switches from an HRS to an LRS is often referred to as a "Set" or "On" event; the process in which a RRAM switches from an HRS (LRS) to an LRS (HRS) is often referred to as a "Reset" or "Off" event.

A Digital-to-Analog Converter (DAC) is a device that converts digital signal into corresponding analog signals; an Analog to Digital Converter (ADC) is a device that converts analog signals into corresponding digital signals. ADCs and DACs may be used as interfaces between crossbars and digital circuits.

Conventional ramped ADCs use a single comparator to compare an input signal voltage with a single-slope ramp voltage signal. When the ramp voltage is greater than the amplitude of the reference voltage, the comparator latches the ramp's count value into memory, which may be read from a chip in a binary number system. This design may function well in applications with a higher resolution requirement, which requires more time to sample the result; this design, however, may not perform well when implemented in a crossbar array circuit for such applications requiring high performance as Artificial Intelligence (AI) computing.

For example, a comparator in an N-bit RAMP ADC allocates $(1/f)*(2N-1)$ seconds for comparison, in which f represents the frequency of the sampling counter (or clock) in the N-bit RAMP ADC. Therefore, either it takes more time to complete the comparison or the data conversion speed of the counter needs to switch at several MHz or GHz to timely retrieve the comparison result. Neither is suitable for matrix multiplication using one or more crossbar array circuits in such applications as Artificial Intelligence computing, in-memory computing, and neuromorphic computing.

SUMMARY

Technologies relating to implementing two-stage ramp ADCs in crossbar array circuits for high performance matrix multiplication are disclosed.

An apparatus, in some implementations, includes: a transimpedance amplifier configured to convert an input signal from current to voltage; a comparator connected to the transimpedance amplifier; a switch bias set connected to the comparator; a switch side capacitor in parallel with the switch bias set; a ramp side capacitor in parallel with the switch bias set; a ramp generator connected to the comparator via the ramp side capacitor, wherein the ramp generator is configured to generate a ramp signal; a counter; and a memory connected to the comparator, wherein the memory is configured to store an output of the comparator.

In some implementations, a capacitance of the ramp side capacitor is higher than that of the switch side capacitor for more than or equal to 3 orders of magnitude.

In some implementations, the switch bias set includes a first switch bias, a second switch bias, and a third switch bias, wherein the MSBs (Most Significant Bits) of the input signal are determined based on a coarse conversion comparison between the voltage of the input signal and a voltage of reference voltages generated via the first switch, the second switch, and the third switch.

In some implementations, a precise voltage of the input signal is determined based on a fine conversion comparison between the voltage of the input signal and a voltage of the ramp signal generated by the ramp generator.

In some implementations, the counter is connected to the comparator.

In some implementations, a count value of the counter is stored in the memory.

In some implementations, a resolution of apparatus is higher or equal to 8 bits.

A crossbar array circuit, in some implementations, includes: one or more bit lines; one or more word lines; one or more 1T1R cells connected between the bit lines and the word lines; one or more DACs connected to the one or more word lines; one or more access controls connected to the one or more 1T1R cells and configured to select a 1T1R cell in the one or more 1T1R cells and to program the selected 1T1R cell; and one or more two-stage ramp ADCs connected to the one or more bit lines, wherein one of the two-stage ramp ADCs includes: a transimpedance amplifier configured to convert an input signal from current to voltage; a comparator connected to the transimpedance amplifier; a switch bias set connected to the comparator; a switch side capacitor in parallel with the switch bias set; a ramp side capacitor in parallel with the switch bias set; a ramp generator connected to the comparator via the ramp side capacitor, wherein the ramp generator is configured to generate a ramp signal; a counter; and a memory connected to the comparator, wherein the memory is configured to store an output of the comparator.

In some implementations, a capacitance of the ramp side capacitor is higher than that of the switch side capacitor for more than or equal to 3 orders of magnitude.

In some implementations, the switch bias set includes a first switch bias, a second switch bias, and a third switch bias, wherein a rough voltage of the input signal is determined based on a coarse conversion comparison between the voltage of the input signal and a voltage of reference voltages generated via the first switch, the second switch, and the third switch.

In some implementations, a precise voltage of the input signal is determined based on a fine conversion comparison between the voltage of the input signal and a voltage of the ramp signal generated by the ramp generator.

In some implementations, the counter is connected to the comparator.

In some implementations, a count value of the counter is stored in the memory.

In some implementations, a resolution of the one or more two-stage ramp ADCs is higher or equal to 8 bits.

In some implementations, the crossbar array circuit is configured to be used in matrix multiplication computing.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Figure 1:
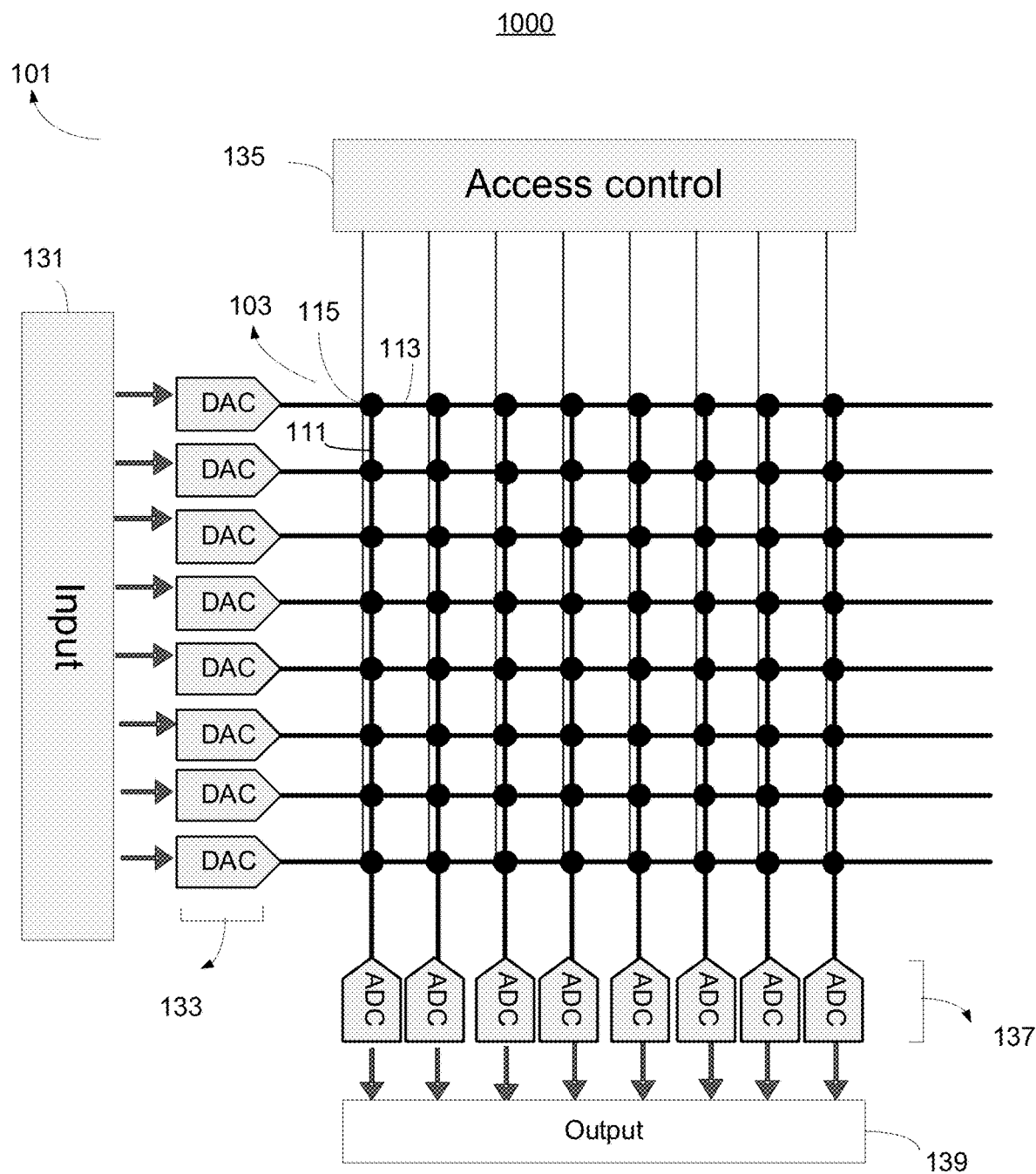
FIG. 1 is a block diagram illustrating an example crossbar array circuit in accordance with some implementations of the present disclosure.

Technologies relating to implementing two-stage ramp ADCs in crossbar array circuits for high performance matrix multiplication are disclosed. The technologies described in the present disclosure may provide the following technical advantages.

First, the two-stage conversion as disclosed increases computing performance. The first stage involves a coarse conversion, which determines a rough interval of a voltage using switch biases within $2^n-1$ cycles; the second stage involves a fine conversion, which determines a precise voltage ranged in the rough interval using a ramp generator within $2^m$ cycles.

Conventionally, the single slope of a ramp signal requires a longer time, such as $2^{n+m}-1$ cycles, to sample a comparison.

With the multiple switch biases, the rough interval of a voltage decided by two sequential switch biases is determined during the coarse conversion, and a precise voltage is determined in accordance with the rough interval of the voltage range only, not the entire voltage range. Therefore, it may take only $(n-1+2^m)$ cycles—as opposed to $2^{n+m}-1$ cycles—to complete a comparison, significantly increasing the sampling speed. This is especially important for applications that require high resolution and high speed computing with simple architecture, such as AI computing, in-memory computing, and neuromorphic computing.

Second, the disclosed technologies may reduce interference. In an example two-stage ADC implemented using the disclosed technologies, a switch side capacitor is coupled with a ramp side capacitor. During the first stage, the first 2 MSBs may be determined in accordance with 4 intervals divided by 3 switch biases while the charge is stored in the switch side capacitor if moving reference voltage from high reference to low reference to determine MSB. During the second stage, the last 6 LSB bits may be determined using a ramp signal. Because the capacitor on the ramp side has a greater capacity than does the total capacitor on the switch bias side, charges stored on the switch side capacitor may be totally coupled up by the ramp signal without interference thereon.

Third, matrix multiplication implemented using one or more crossbar array circuits for the purpose of AI computing computer often require a high speed, high accuracy, low power, and small area size ADC. The disclosed technologies enhance the resolution and speed of an ADC without requiring additional complex integrated circuits.

As mentioned above, conventional ramped ADCs use a single comparator to compare the input signal voltage level with a ramp voltage signal. When the ramp voltage becomes greater than the amplitude of the input signal, the comparator registers the ramp's count value into a memory; the registered value may then be read from the memory and provided to computing applications. If the bits are higher, such as eight or more bits, the sampling time may be longer (e.g., $2^8=256$ cycles); alternatively, the sampling frequency (ADC conversion speed) needs to be maintained high to enable a high computing speed. Neither may be practical for implementation in a crossbar array circuit.

FIG. 1 is a block diagram 1000 illustrating an example crossbar array circuit 101 in accordance with some implementations of the present disclosure.

As shown in FIG. 1, the crossbar array circuit 101 includes a crossbar array 103 with one or more of bit lines (e.g., a bit line 111), one or more word lines (e.g., a word line 113), and one or more cross-point devices (e.g., a 1T1R cell 115) positioned below and connected with bit lines and word lines.

The crossbar array circuit 101 may further include an input signal generator 131, which is configured to provide input signals; one or more DACs (e.g., a DAC 133) connected with the input signal generator 131 and the word lines 113, where the DAC 133 is configured to receive input signals from the input signal generator 131; one or more access controls (e.g., an access control 135) connected to the 1T1R cells 115, where the access control 135 is configured to select a 1T1R cell for programming; one or more ADCs (e.g., an ADC 137) connected to the bit lines 111; and an output register (e.g., the register 139) connected to the ADCs 137.

The cross-point device 115 is, in some implementations, one of: a memristor, a memristive device, a Pulse-Code Modulation (PCM) device, a floating date, a phase change device, a Resistive Random-Access Memory (RRAM or ReRAM), a Magnetoresistive Random-Access Memory (MRAM), a Dynamic Random-Access Memory (DRAM), a Static Random-Access Memory (static RAM or SRAM), or other devices with tunable resistance.

The cross-point device 115 is of, in some implementations, 1-Transistor-1-Resistor (1T1R) structure, 1-Selector-1-Resistor (1S1R) structure, or 2-Resistor (2R) structure.

As explained above, during matrix multiplication operations, a crossbar array circuit requires one or more ADCs with higher speed and higher resolution to convert a current into a voltage. In some implementations, the resolution of an ADC to satisfactorily perform matrix multiplication operations is at least 8 bits.

Figure 2:
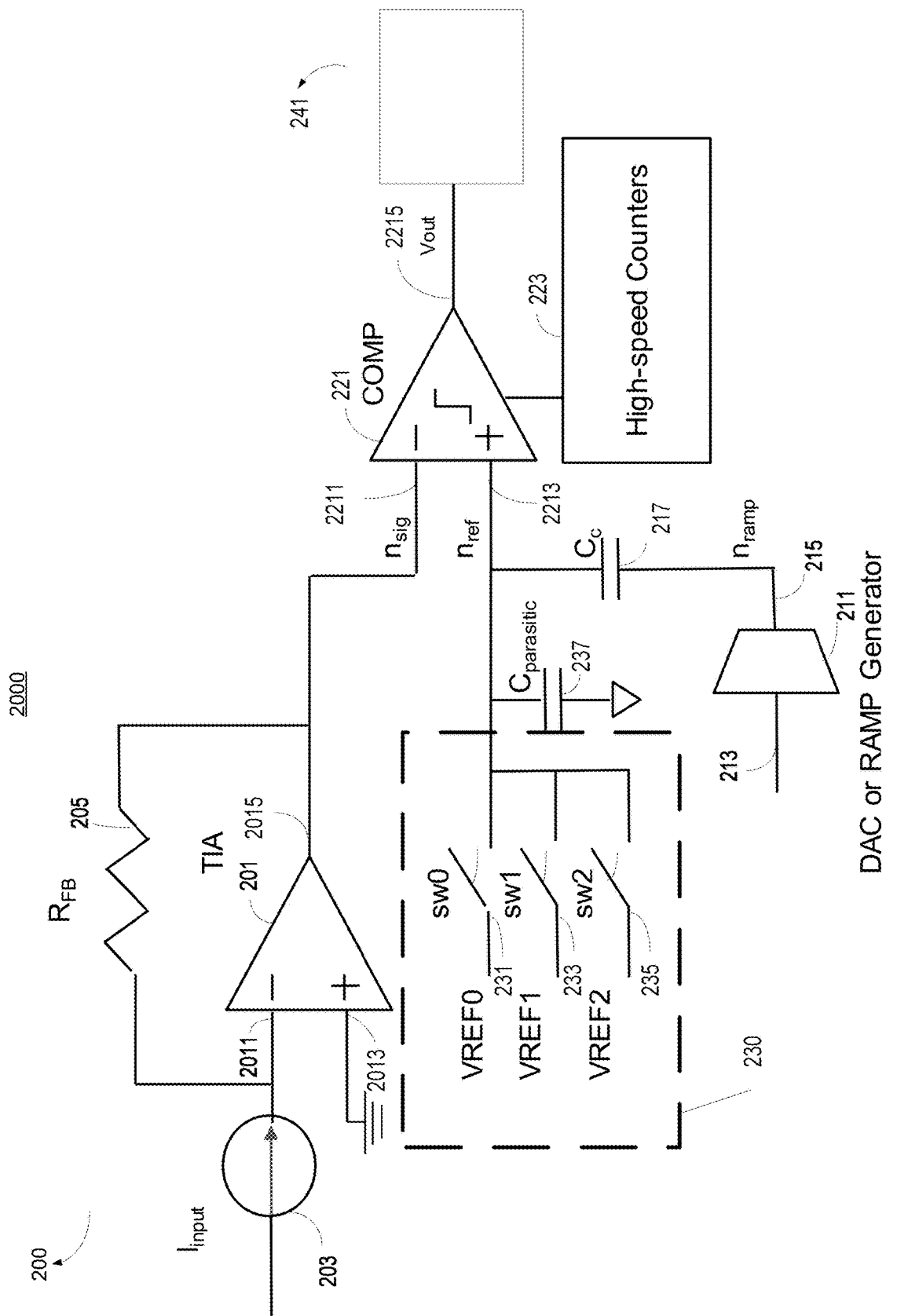
FIG. 2 is a block diagram illustrating an example two-stage ramp ADC in accordance with some implementations of the present disclosure.

FIG. 2 is a block diagram 2000 illustrating an example two-stage ramp ADC 200 in accordance with some implementations of the present disclosure. The two-stage ramp ADC 200 may be one of the ADCs 137 shown in FIG. 1.

As shown in FIG. 2, the two-stage ramp ADC 200 includes a Trans-Impedance Amplifier (TIA) 201 (which may be a current to voltage converter), a comparator 221 connected to the TIA 201, a switch bias set 230 in parallel with a switch side capacitor 237 connected to the comparator 221, a ramp generator 211 connected to the comparator 221 via a ramp side capacitor 217, a counter 223, and a memory 241 connected to the comparator 221.

The two-stage ramp ADC 200, in some implementations, includes a current input 203 connected to a first input end 2011 of the TIA 201, and a feedback resistance 205 connected between the first input end 2011 and an output end 2015 of the TIA 201. A second input end 2013 of the TIA 201 may be grounded. The output end 2015 may be connected to a first input end 2211 of the comparator 221. A signal in node $n_{sig}$ may be transmitted from the output end 2015 to the comparator 221.

The switch bias set 230, in some implementations, includes a first switch 231, a second switch 233, and a third switch 235. These switches may be in parallel with each other. During a coarse conversion stage, a MSB of the input signal 203 may be determined based on a coarse conversion comparison between (1) the voltage of the input signal 203 and (2) a voltage of the reference voltages $V_{REF0}$, $V_{REF1}$, and $V_{REF2}$, which are generated by the first switch 231, the second switch 233, and the third switch 235, respectively.

The switch bias set 230, in some implementations, includes more than three biases. In some implementations, four voltage intervals are used to identify the intervals of the precise voltage; thus, three biases are sufficient for the purpose of such identification. In other implementations, more than four voltage intervals are used to identify the intervals of the precise voltage; thus, more than three biases may be used. For instance, when 2 bits need to be stored during a coarse conversion, four intervals with $2^2-1$ switch biases may be needed. When 3 bits need to be stored during a coarse conversion, 8 intervals with $2^3-1$ switch biases may be needed. Technologies relating to voltage intervals are discussed in greater detail with reference to FIG. 3.

The switch side capacitor 237 and the ramp side capacitor 217 are, in some implementations, both in parallel with the switch bias set 230; and both the switch side capacitor 237 and the ramp side capacitor 217 are connected to the second input end 2213 of the comparator 221. After a coarse conversion processing involving 2 bits completes, charges are stored on the ramp side capacitor 217 and become a reference voltage to be ramped.

In some implementations, a capacitance of the ramp side capacitor 217 is significantly higher than that of the switch side capacitor 237. Therefore, during the fine conversion stage, the node $N_{ref}$ may be coupled up nearly 100% by the node $N_{ramp}$. The capacitance of the ramp side capacitor 217 may be to 3 orders of magnitude higher than the capacitance of the switch side capacitor 237.

An initial signal 213 may be provided to the ramp generator 211; and a ramp signal on the node $n_{ramp}$ is generated toward the second input end 2213 of the comparator 221 via the ramp side capacitor 217. A precise voltage of the input signal 203 may be determined in accordance with a fine conversion comparison between the voltage of the input signal 203 and a voltage of the ramp signal 215 generated by the ramp generator 211.

Through the duration of $2^6$ cycle counting time of a fine conversion, the final LSB 6-bit of ADC could be achieved. Using both a coarse conversion and a fine conversion, a total of 8-bit resolution may be achieved within only $3+2^6=67$ cycle counting time by using the two-stage ramp ADC 200 and the two-stage process as discussed in the present disclosure. The disclosed technologies, therefore, are more time-efficient than are conventional ramp ADCs, which usually take $2^8=256$ cycle time to achieve the same resolution.

In some implementations, the ramp generator 211 may be a DAC. In some implementations, a counter 223 is provided and connected to the comparator 221. And in some implementations, a count value of the counter 223 may be stored in the memory 241.

Figure 3:
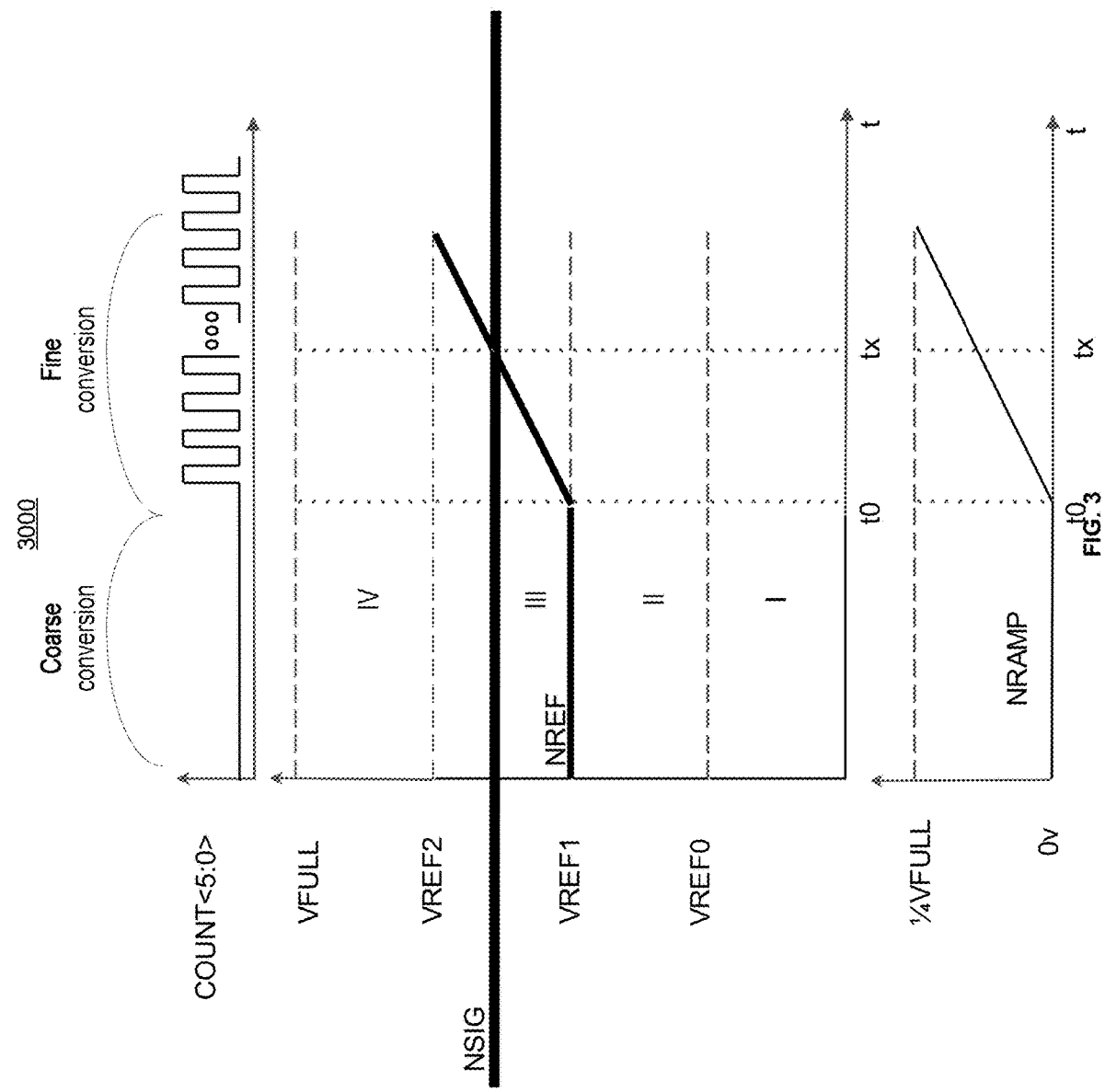
FIG. 3 is a voltage chart illustrating an example comparison between signals on node $N_{sig}$ and signals on node $N_{ref}$ using a coarse conversion and a fine conversion in accordance with some implementations of the present disclosure.

FIG. 3 is a voltage chart 300 illustrating an example comparison between signals on node $N_{sig}$ and signals on node $N_{ref}$ using a coarse conversion and a fine conversion in accordance with some implementations of the present disclosure.

As shown in FIG. 3, there are four intervals, intervals I, II, III, and IV separated by three switch biases with voltage $V_{REF0}$, $V_{REF1}$, and $V_{REF2}$. During a coarse conversion, the rough voltage of the input signal in node $N_{sig}$ is determined (e.g., approximated) to be among the voltage interval III, in between $V_{REF1}$ and $V_{REF2}$. Therefore, during the fine conversion, a precise voltage of the input signal in node $N_{sig}$ may be determined, with more precision, at time $t_x$ by the ramping signal.

By implementing the two-stage conversion process using the two-stage ramp ADC 200 in a crossbar array circuit, the slope of the ramping signal is maintained while the switch bias set raises the voltage baseline of the ramping signal to accelerate the search speed. Because the ramping signal on the node $N_{ramp}$ may be started to search the input signal on node $N_{sig}$ based on the $V_{REF1}$, only $2^6$ cycle time (as opposed to $2^8$ cycle time) may be needed to retrieve the input signal on node $N_{sig}$. Therefore, the sampling rate of the two-stage ramp ADC 200 is increased significantly, a high desirable feature.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises"

and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus comprising:
    a transimpedance amplifier configured to convert an input signal from current to voltage;
    a comparator connected to the transimpedance amplifier;
    a switch bias set connected to the comparator, wherein the switch bias set comprises a first switch, a second switch, and a third switch, and wherein a rough voltage of the input signal is determined based on a coarse conversion comparison between a voltage of the input signal and a voltage of reference voltages generated via the first switch, the second switch, and the third switch;
    a switch side capacitor in parallel with the switch bias set;
    a ramp side capacitor in parallel with the switch bias set;
    a ramp generator connected to the comparator via the ramp side capacitor, wherein the ramp generator is configured to generate a ramp signal;
    a counter; and
    a memory connected to the comparator, wherein the memory is configured to store an output of the comparator.

2. The apparatus as claimed in claim 1, wherein a capacitor of the ramp side capacitor is higher than that of the switch side capacitor for more than or equal to 3 orders of magnitude.

3. The apparatus as claimed in claim 1, wherein a precise voltage of the input signal is determined based on a fine conversion comparison between the voltage of the input signal and a voltage of the ramp signal generated via the ramp generator.

4. The apparatus as claimed in claim 1, wherein the counter is connected to the comparator.

5. The apparatus as claimed in claim 1, wherein a count value of the counter is stored in the memory.

6. The apparatus as claimed in claim 1, wherein a resolution of apparatus is higher or equal to 8 bits.

7. A crossbar array circuit comprising:
    one or more bit lines;
    one or more word lines;
    one or more 1T1R (1-Transistor-1-Resistor) cells connected between the bit lines and the word lines;
    one or more DACs (Digital-to-Analog Converters) connected to the one or more word lines;
    one or more access controls connected to the one or more 1T1R cells and
    configured to select a 1T1R cell in the one or more 1T1R cells and to program the selected 1T1R cell; and
    one or more two-stage ramp ADCs (Analog-to-Digital Converters) connected to the one or more bit lines, wherein one of the two-stage ramp ADCs comprises:
        a transimpedance amplifier configured to convert an input signal from current to voltage;
        a comparator connected to the transimpedance amplifier;
        a switch bias set connected to the comparator, wherein the switch bias set comprises a first switch, a second switch, and a third switch, and wherein a rough voltage of the input signal is determined based on a coarse conversion comparison between a voltage of the input signal and a voltage of reference voltages generated via the first switch, the second switch, and the third switch;
        a switch side capacitor in parallel with the switch bias set;
        a ramp side capacitor in parallel with the switch bias set;
        a ramp generator connected to the comparator via the ramp side capacitor, wherein the ramp generator is configured to generate a ramp signal;
        a counter; and
        a memory connected to the comparator, wherein the memory is configured to store an output of the comparator.

8. The crossbar array circuit as claimed in claim 7, wherein a capacitor of the ramp side capacitor is higher than that of the switch side capacitor for more than or equal to 3 orders of magnitude.

9. The crossbar array circuit as claimed in claim 7, wherein a precise voltage of the input signal is determined based on a fine conversion comparison between the voltage of the input signal and a voltage of the ramp signal generated via the ramp generator.

10. The crossbar array circuit as claimed in claim 7, wherein the counter is connected to the comparator.

11. The crossbar array circuit as claimed in claim 7, wherein a count value of the counter is stored in the memory.

12. The crossbar array circuit as claimed in claim 7, wherein a resolution of the one or more two-stage ramp ADCs is higher or equal to 8 bits.

13. The crossbar array circuit as claimed in claim 7, wherein the crossbar array circuit is configured to be used in matrix multiplication computing.

* * * * *